Figure 1:
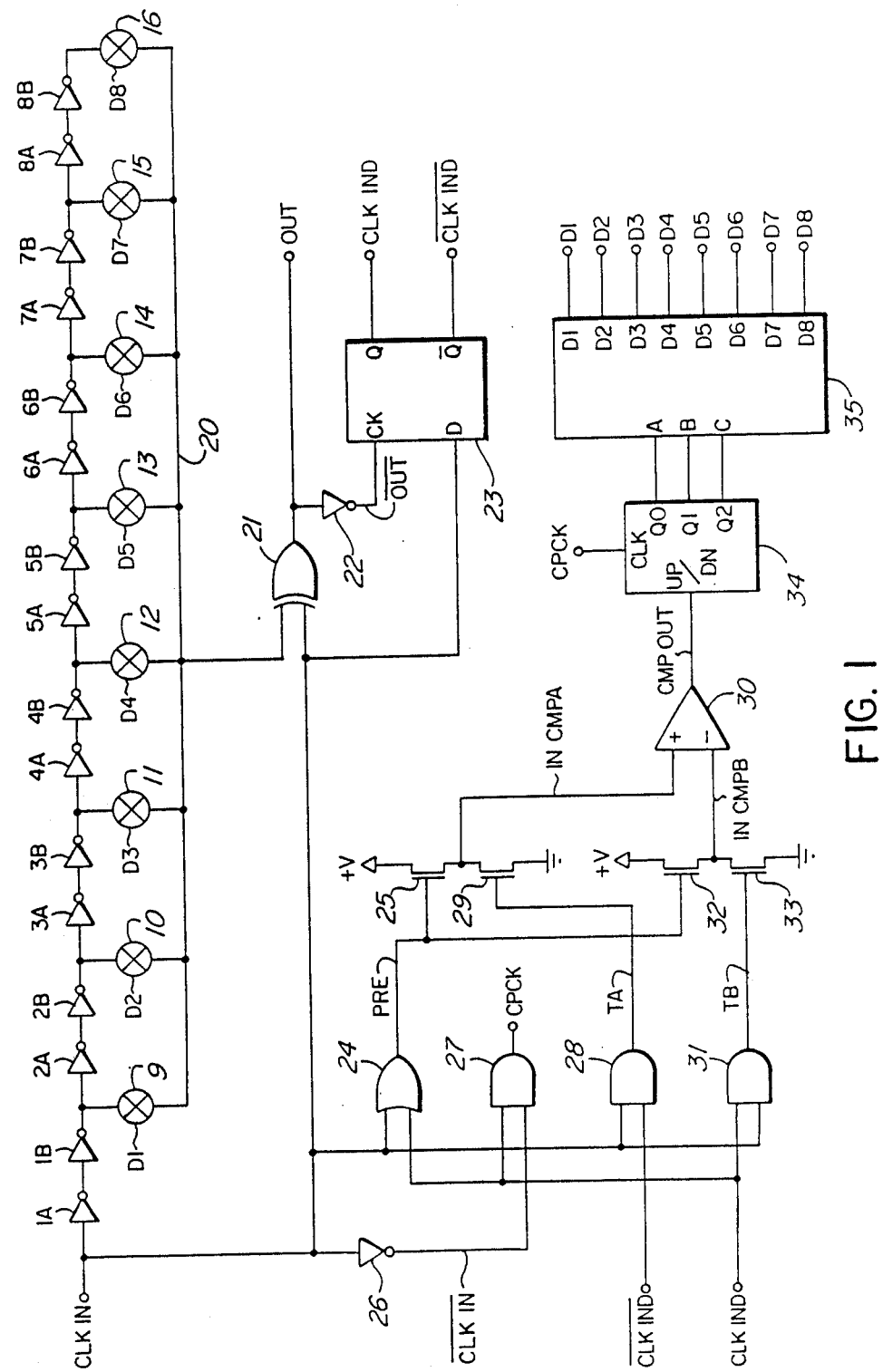

United States Patent [19]

Skierszkan

[11] Patent Number: 4,799,022
[45] Date of Patent: Jan. 17, 1989

[54] FREQUENCY DOUBLER WITH DUTY CYCLE MONITOR MEANS

[75] Inventor: Simon J. Skierszkan, Nepean, Canada

[73] Assignee: Mitel Corporation, Canada

[21] Appl. No.: 108,264

[22] Filed: Oct. 13, 1987

[30] Foreign Application Priority Data

Nov. 7, 1986 [CA] Canada ................................ 522,500

[51] Int. Cl.⁴ .......................... H03B 19/10; H03B 5/20
[52] U.S. Cl. ...................................... 328/20; 307/271; 307/234; 307/265
[58] Field of Search ................... 328/20, 15, 120, 111, 328/140, 55; 307/471, 602, 271, 603, 234, 265, 267, 479; 377/47

[56] References Cited

U.S. PATENT DOCUMENTS

| | | | |
|---|---|---|---|
| 4,027,258 | 5/1977 | Perreault | 333/166 X |
| 4,368,434 | 1/1983 | Miller et al. | 328/140 X |
| 4,596,954 | 6/1986 | Hague | 328/20 |

*Primary Examiner*—Stanley D. Miller
*Assistant Examiner*—Timothy P. Callahan
*Attorney, Agent, or Firm*—Laff, Whitesel, Conte & Saret

[57] ABSTRACT

A frequency doubler for receiving an input clock signal and generating an output signal at twice the input signal frequency and having fifty percent duty cycle. The input signal is received by a tapped delay line and transmitted from a predetermined tap thereof to a first input of an EXCLUSIVE OR gate. The second input of the EXCLUSIVE OR gate receives the undelayed input clock signal and generates the output clock signal in response to performing an EXCLUSIVE OR operation on the delayed and undelayed signals. The duty cycle of the output signal is monitored via a comparator in combination with logic circuitry. The output of the comparator is connected to the up/down input of a digital counter which is clocked once for each cycle of the input signal, and generates a digital count value in response thereto. In the event that the monitored duty cycle is less than fifty percent, the comparator generates an up count signal for incrementing the digital counter. In the event that the duty cycle is greater than fifty percent, the comparator generates a down count signal for decrementing the counter. The counter output is connected to a decoder circuit for decoding the digital count valve and generating a signal to enable one of the taps of the delay line, thereby compensating for drift in the components comprising the delay line, and maintaining the output signal at fifty percent duty cycle.

14 Claims, 2 Drawing Sheets

FREQUENCY DOUBLER WITH DUTY CYCLE MONITOR MEANS

This invention relates in general to digital timing circuits, and more particularly to a frequency doubler for receiving an input clock signal and generating an output signal at twice the input frequency and having a fifty percent duty cycle.

Frequency doubling of clock signals is utilized in computer systems for initiating events such as, for example, updating data at the mid-point of a clock signal pulse. For instance, memory cells within random access memories (RAMs) are frequently required to be precharged, read, recharged, and then written to, all within a single local clock cycle. This procedure is known in the art as a "read, modify, write" operation. Accordingly, a frequency doubled clock signal is required to be generated, for initiating the precharge, read, recharge and write operations simultaneously with the double frequency clock signal level transitions. Thus, the generated double frequency clock signal is required to be characterized by rising level transitions simultaneous with the rising and falling transitions of the main clock signal, and falling transitions simultaneous with the mid-points of each half-cycle of the main clock signal.

According to the prior art, frequency doubling was achieved by cascading a plurality of inverters, and connecting the output of the last cascaded inverter to one input of an EXCLUSIVE OR gate. The input clock signal was applied to the second input of the EXCLUSIVE OR gate and to the input of the cascaded inverters. By accurately specifying the delay generated by the cascaded inverters, having regard to the input signal clock frequency, the signal applied to the first EXCLUSIVE OR gate input is delayed from the input clock signal by one quarter cycle, (i.e. a 90° phase shift), causing the EXCLUSIVE OR gate to generate the appropriate double frequency output clock signal, as described above.

The fundamental disadvantage of such prior art frequency doublers is that the components which comprise the inverters are typically both temperature and voltage sensitive. Thus, the time delay provided by the cascaded inverters varies in an unpredictable manner in response to variations in temperature and supply voltage. Hence, the double frequency clock signal output from the EXCLUSIVE OR gate is characterized by a duty cycle which has a tendency to vary such that the positive and negative output clock signal transitions do not occur simultaneously with the mid-points of the input clock signal half-cycles. This can result in erroneous operation of the "read, modify, write" procedure discussed above.

According to the present invention, a plurality of cascaded inverters are provided forming a tapped delay line, for receiving and delaying an input clock signal by a predetermined amount. First terminals of a plurality of signal gates are connected to respective outputs of predetermined ones of the inverters. The other terminals of the signal gates are connected together and to a first input of an EXCLUSIVE OR gate. The second input of the EXCLUSIVE OR gate receives the undelayed input clock signal as described above with reference to the prior art.

The duty cycle of the double frequency signal output from the EXCLUSIVE OR gate is monitored by a control circuit, and in the event the duty cycle is greater that fifty percent, the control circuit generates a signal for enabling a predetermined one of the transmission gates in order to decrease the amount of delay in the delay line. Conversely, in the event the duty cycle is less than fifty percent, the control circuit generates a signal for enabling a different predetermined one of the transmission gates for increasing the amount of delay, thereby restoring the output signal duty cycle to fifty percent.

The output signal transitions are maintained at the mid-points of the input clock signal half-cycles, thereby overcoming the disadvantage of prior art frequency doublers wherein the pulse width and duty cycle varied in an unpredictable manner.

The circuit according to the present invention utilizes inexpensive and simple logic components in combination with a comparator, digital counter and decoder. The circuit can be advantageously implemented on a semiconductor chip, such as a CMOS circuit, in a straightforward manner.

Figure 2:
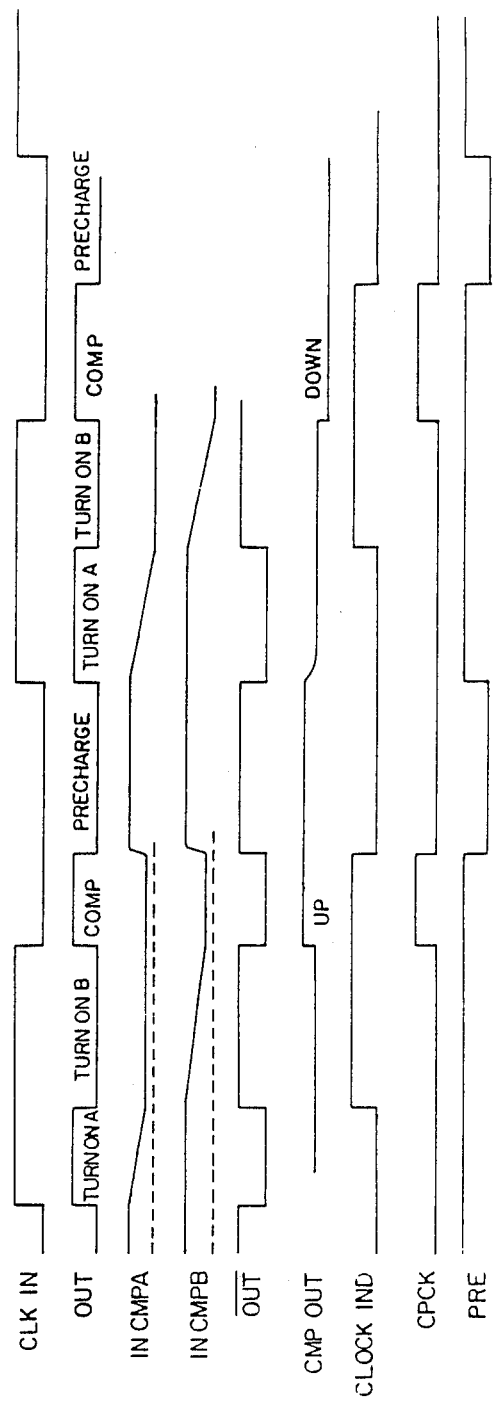

A better understanding of the invention will be obtained with reference to the detailed description below in conjunction with the following drawings, in which:

FIG. 1 is a schematic diagram of a frequency doubler according to a preferred embodiment of the present invention, and FIG. 2 is a timing waveform diagram illustrating the operation of the circuit in FIG. 1.

With reference to FIG. 1, an input clock signal CLKIN is applied to a plurality of cascaded inverters, arranged as a succession of delay elements, 1A, 1B to 8A, 8B. The clock signal is delayed by respective ones of the delay elements and applied to a signal lead 20 via a predetermined enabled one of a plurality of signal transmission gates 9 to 16.

Lead 20 is connected to a first input of an EXCLUSIVE OR gate 21, the second input of which is connected for receiving the input clock signal CLKIN. The output of EXCLUSIVE OR gate 21 is connected to an output terminal OUT.

The output of EXCLUSIVE OR gate 21 is also connected via an inverter 22 to the clock input (CK) of a flip-flop 23. The input clock signal CLKIN is applied to the data input (D) of the flip-flop 23, which generates a delayed or phase shifted version of the input clock signal, denoted CLKIND, from the Q output thereof in response to receiving a trigger signal on the CK input thereof, from the output of EXCLUSIVE OR gate 21. The $\bar{Q}$ output generates an inverted version of the delayed clock signal, denoted as $\overline{\text{CLKIND}}$.

The CLKIND signal is applied to a first input of an OR gate 24, the second input of which is connected for receiving the input clock signal CLKIN. Gate 24 generates a precharge signal PRE which is connected to the gate input of a MOS transistor 25.

The input clock signal CLKIN is inverted via a further inverter 26 and applied to a first input of an AND gate 27, the second input of which is connected for receiving the CLKIND signal. Gate 27 generates a trigger pulse CPCK, described in greater detail below.

A second AND gate 28 receives the CLKIN signal on a first input thereof and the inverted delayed clock signal $\overline{\text{CLKIND}}$ on the second input thereof, and in response generates a signal TA representative of the pulse width of the first half cycle of the output signal OUT from EXCLUSIVE OR gate 21. The TA signal is applied to the gate input of a second MOS transistor 29.

Transistors 25 and 29 are connected in series between a source of positive voltage +V and ground. A node connecting the transistors carries a signal IN CMPA for application to the non-inverting input of a comparator 30.

An additional AND gate 31 receives the clock signal CLKIN on a first input thereof and the delayed clock signal CLKIND on the second input thereof and generates a further signal TB indicative of the pulse width of the second half cycle of the output signal from EXCLUSIVE OR gate 21.

The PRE signal output from OR gate 24 is also applied to the gate input of a further MOS transistor 32, and the TB signal output from AND gate 31 is applied to the gate input of yet another MOS transistor 33 connected in series with transistor 32 between the source of positive voltage +V and ground. A node connecting transistors 32 and 33 carries a signal denoted IN CMPB for application to the inverting input of comparator 30.

The output of comparator 30 carries a signal denoted as CMPOUT. The CMPOUT signal is applied to an up/down control input (UP/DN) of a 3-bit digital counter 34. Counter 34 can, of course, be a 4-bit (or greater) counter with only three outputs being utilized. The trigger pulse CPCK generated by AND gate 27 is applied to a clock input (CLK) of counter 34. The Q0–Q2 outputs of counter 34 are connected to A, B and C control inputs of a 3-to-8 bit decoder 35 for generating and applying enable signals D1–D8 to respective ones of transmission gates 9 to 16 discussed above.

Thus, in operation, the OR gate 24 in conjunction with AND gates 27, 28 and 31, generate the aforementioned precharge (PRE), trigger clock (CPCK) and pulse width (TA and TB) control signals in response to performing the designated logic operations on the input clock signal CLKIN, its complement $\overline{\text{CLKIN}}$, the delayed version of CLKIN denoted as CLKIND, and its complement $\overline{\text{CLKIND}}$.

With reference to FIG. 2, in the event the pulse width of the negative portion of the output signal OUT is longer than the pulse width of the positive portion, the generated TB signal output from AND gate 31 is characterized by a positive pulse which is of longer duration (i.e. wider) than the positive TA pulse output from AND gate 28. Therefore, the inverting input of comparator 30 is grounded via transistor 33 and the non-inverting input thereof is connected to +V in response to NOR gate 24 generating a positive PRE pulse for enabling transistor 25. As a result, comparator 30 generates a logic high signal CMPOUT which is applied to the UP/DN input of counter 34. In response to receiving the logic high CMPOUT signal and the CPCK trigger pulse, counter 34 increments the count value applied to the Q0–Q2 outputs. This 3-bit count value is decoded via decoder 35 such that a predetermined one of the outputs D1–D8 generates a signal for enabling a predetermined one of the gates 9–16.

Thus, for example, if transmission gate 12 had been previously enabled, and the digital count value from counter 34 is incremented, decoder 35 generates an enable signal on the D5 output thereof for enabling transmission gate 13 instead of gate 12, thereby increasing the input clock signal delay applied to the first input of EXCLUSIVE OR gate 21. By increasing the delay, the duration of the first half cycle of the output clock signal OUT, is increased, as shown in FIG. 2.

Conversely, if the first half cycle of the output clock signal is longer than the second half cycle, comparator 30 generates a logic low CMPOUT signal, causing the digital count value from counter 34 to be decremented upon receipt of the CPCK pulse. Hence, decoder 35 decodes the decremented 3-bit count value and enables gate 11 instead of gate 12, thereby decreasing the input clock signal delay applied to the first input of EXCLUSIVE OR gate 21. By decreasing the delay, the duration of the first half-cycle of the OUT signal is decreased.

Accordingly, in the event of temperature or voltage induced variations in the delay time provided by the cascaded delay elements (i.e. pairs of inverters 1A, 1B to 8A, 8B), the output signal (OUT) duty cycle is monitored and the correct delay line tap is enabled for maintaining fifty percent duty cycle of the output signal OUT regardless of such temperature and voltage variations.

A person understanding the present invention may conceive of further embodiments or variations therein, all of which are believed to be within the sphere and scope of the present invention as defined by the claims appended hereto.

I claim:

1. A frequency doubler for receiving an input clock signal of predetermined frequency and generating an output signal at twice said frequency, comprised of:
   (a) delay line means for receiving and delaying said input clock signal by a predetermined amount,
   (b) an EXCLUSIVE OR gate having first and second inputs for receiving said input clock signal and said delayed input clock signal respectively, and generating said output signal at twice said predetermined frequency in response thereto, and
   (c) control means for monitoring the duty cycle of said output signal and in the event said duty cycle is greater than fifty percent adjusting said delay line means to decrease said predetermined amount of delay, and in the event said duty cycle is less than fifty percent adjusting said delay line means to increase said predetermined amount of delay, whereby said output signal duty cycle is maintained at fifty percent.

2. A frequency doubler as defined in claim 1, wherein said delay line means is a tapped delay line comprising a plurality of cascaded delay elements and means for selectively connecting the output of a predetermined one of said elements to said second input of the EXCLUSIVE OR gate under control of said control means.

3. A frequency doubler as defined in claim 2, wherein said delay elements are each comprised of one or more cascaded inverters, and said means for connecting is comprised of one or more gate circuits connected between respective outputs of said cascaded inverters and said second input of the EXCLUSIVE OR gate, and having control inputs thereof connected to said control means.

4. A frequency doubler as defined in claim 3, wherein said control means is further comprised of:
   (a) flip-flop means for receiving said input clock signal on a data input thereof, receiving said output signal on a clock input thereof, and generating a further delayed input clock signal in response thereto,
   (b) logic circuitry for receiving at least said input clock signal and further delayed input clock signal and generating first and second signals indicative of the duration of first and second half cycles of said output signal in response thereto, (c) a comparator for receiving and comparing said first and second signals and generating an up count signal in the event said first half cycle is less than said second half cycle, and generating a down count signal in the event said first half cycle is greater than said second half cycle, (d) a counter for receiving one of either said up or down count signals and counting either upwardly or downwardly in response thereto, thereby generating a digital count signal, and (e) a decoder for receiving and decoding said digital count signal and generating and applying a predetermined decoded enable signal to a predetermined one of said gate circuits for enabling said predetermined gate circuit in response thereto.

5. A frequency doubler as defined in claim 1, wherein said control means is further comprised of:

(a) means for measuring the duration of successive half cycles of said output signal and generating an up control signal in the event the first half cycle is less than the second half cycle, and generating a down control signal in the event said first half cycle is greater than said second half cycle, (b) means for receiving successive cycles of said input clock signal and generating a succession of trigger pulses in response thereto, (c) counter means for receiving said trigger pulses and one of either said up or down control signals, counting said pulses either upwardly or downwardly respectively, and generating a count signal in response thereto, and (d) means for receiving and decoding said count signal and generating further control signals for adjusting said delay line means to increase or decrease said predetermined amount of delay in response to said counter means counting upwardly or downwardly, respectively.

6. A frequency doubler as defined in claim 2, wherein a first one of said cascaded delay elements introduces a first delay of approximately 80 nsec, and successive ones of said delay elements introduce successive additional delays of approximately 20 nsec, said additional delays facilitating fine tuning of said output signal duty cycle.

7. A frequency doubler as defined in claim 1, wherein said predetermined frequency is approximately 1.54 MHz and said output signal frequency is approximately 3.086 MHz.

8. A frequency doubler as defined in claim 4, wherein said counter is a three-bit up/down counter, and said decoder is a 3-to-8 bit decoder for enabling one of eight of said gate circuits.

9. A frequency doubler as defined in claim 2, wherein said control means is further comprised of:

(a) means for measuring the duration of successive half cycles of said output signal and generating an up control signal in the event the first half cycle is less than the second half cycle, and generating a down control signal in the event said first half cycle is greater than said second half cycle, (b) means for receiving successive cycles of said input clock signal and generating a succession of trigger pulses in response thereto, (c) counter means for receiving said trigger pulses and one of either said up or down control signals, counting said pulses either upwardly or downwardly respectively, and generating a count signal in response thereto, and (d) means for receiving and decoding said count signal and generating further control signals for adjusting said delay line means to increase or decrease said predetermined amount of delay in response to said counter means counting upwardly or downwardly, respectively.

10. A frequency doubler as defined in claim 3, wherein said control means is further comprised of:

(a) means for measuring the duration of successive half cycles of said output signal and generating an up control signal in the event the first half cycle is less than the second half cycle, and generating a down control signal in the event said first half cycle is greater than said second half cycle, (b) means for receiving successive cycles of said input clock signal and generating a succession of trigger pulses in response thereto, (c) counter means for receiving said trigger pulses and one of either said up or down control signals, counting said pulses either upwardly or downwardly respectively, and generating a count signal in response thereto, and (d) means for receiving and decoding said count signal and generating further control signals for adjusting said delay line means to increase or decrease said predetermined amount of delay in response to said counter means counting upwardly or downwardly, respectively.

11. A frequency doubler as defined in claim 3, wherein a first one of said cascaded delay elements introduces a first delay of approximately 80 nsec, and successive ones of said delay elements introduce successive additional delays of approximately 20 nsec, said additional delays facilitating fine tuning of said output signal duty cycle.

12. A frequency doubler as defined in claim 4, wherein a first one of said cascaded delay elements introduces a first delay of approximately 80 nsec, and successive ones of said delay elements introduce successive additional delays of approximately 20 nsec, said additional delays facilitating fine tuning of said output signal duty cycle.

13. A frequency doubler as defined in claim 2, wherein said predetermined frequency is approximately 1.54 MHz and said output signal frequency is approximately 3.086 MHz.

14. A frequency doubler as defined in claim 3, wherein said predetermined frequency is approximately 1.54 MHz and said output signal frequency is approximately 3.086 MHz.

* * * * *